United States Patent [19]
Lee et al.

[11] Patent Number: 5,763,317
[45] Date of Patent: Jun. 9, 1998

[54] METHOD FOR PBLOCOS ISOLATION BETWEEN SEMICONDUCTOR DEVICES

[75] Inventors: Chang-Jin Lee, Pusan; Kwang-Soo Seo, Seoul; Eui-Sik Kim, Ich'on, all of Rep. of Korea

[73] Assignee: Hyundai Electronics Industries Co., Ltd., Kyoungki-do, Rep. of Korea

[21] Appl. No.: 773,161

[22] Filed: Dec. 26, 1996

[30] Foreign Application Priority Data

Dec. 30, 1995 [KR] Rep. of Korea ............... 95-69488

[51] Int. Cl.$^6$ ........................................ H01L 21/76
[52] U.S. Cl. ................................................ 438/448
[58] Field of Search ........................ 438/448, 229, 438/230

[56] References Cited

U.S. PATENT DOCUMENTS

| | | |
|---|---|---|
| 5,093,277 | 3/1992 | Arima et al. |
| 5,192,707 | 3/1993 | Hodges et al. |
| 5,318,922 | 6/1994 | Lim et al. |
| 5,358,893 | 10/1994 | Yang et al. |

OTHER PUBLICATIONS

Sung, J.M. "The Impact of Poly–Removal Techniques on Thin Thermal Oxide Property in Poly–Buffer LOCOS Technology". IEEE Transactions on Electron Devices, vol.38, No.8, pp. 1970–1973, Aug. 1991.

Primary Examiner—George R. Fourson
Attorney, Agent, or Firm—Ware, Fressola, Van Der Sluys & Adolphson LLP

[57] ABSTRACT

Disclosed is a method for the isolation between active regions of a semiconductor device. The method provides an poly buffered local oxidation of silicon(PBLOCOS) technology. In this method, a non-doped polysilicon layer and the overlying amorphous silicon layer are used as a buffer layer. To form a field oxide region for isolation between semiconductor devices, first a pad oxide film, the buffer layer, silicon nitride layer are formed on a semiconductor substrate. Thereafter, patterning is performed to expose the pad oxide film at a selected region. Lastly, thermal oxidation is performed, thereby the exposed pad oxide is grown to form the field oxide.

12 Claims, 2 Drawing Sheets

METHOD FOR PBLOCOS ISOLATION BETWEEN SEMICONDUCTOR DEVICES

BACKGROUND OF THE INVENTION

1. Field of the Invention

The present invention relates generally to a method for forming a semiconductor device. More specifically, the invention is directed to a method for forming a field oxide layer for isolation between active regions in a semiconductor device.

2. Description of the Related Art

In fabricating a semiconductor device, for example, in a memory cell such as DRAM, SRAM etc., isolation between the devices is typically achieved by a local oxidation of silicon(LOCOS) technique.

According to the LOCOS technique, a pad oxide film, nitirde layer, and any other layers are formed on a semiconductor substrate, and the above-mentioned layers are patterned such that a region for isolation between active regions in a semiconductor devices is exposed. Thereafter, to form a field oxide at the exposed region in the semiconductor substrate, a thermal oxidation process is performed.

However, when the field oxidation layer is formed by the above-mentioned conventional LOCOS isolation process, some oxidant also diffuses laterally at the edges of the nitride. This causes the oxide to grow under and lift the nitride edges. Since the shape of the oxide at the nitride edges is that of a slowly tapering oxide wedge that merges into the pad oxide, it has been referred to a "bird's beak". The bird's beak is a lateral extension of the field oxide into the active area of the devices, and therefore results in the problem of decreasing the active regions.

There have been provided various methods in order to solve the problem. One method is poly buffered LOCOS (PBLOCOS) technology.

Isolation method according to the PBLOCOS technology prevents a stress from being transferred into a substrate and active region from decreasing due to bird's beak by forming polysilicon layer between pad oxide layer and silicon nitride layer.

FIGS. 1A–1C show an isolation method using PBLOCOS technology accordinng to the conventional art.

Referring to FIG. 1A, a pad oxide 2 is formed at a selected thickness on a semiconductor substrate 1, to prevent defects due to stress transferred into the active regions. Non-doped polysilicon layer 3 is formed on the pad oxide 2, to prevent decrease in active regions due to lateral oxidation. The polysilicon layer 3 is formed by a low pressure chemical vapor deposition technology wherein supplying gas is silane $SiH_4$ and temperature is 600°–650° C. A silicon nitride layer 4 is formed on the non-doped polysilicon layer 3 at a selected temperature and a selected thickness using LPCVD technology wherein supplying gas is $SiH_2Cl_2$. Thereafter, through the masking and etching steps, the silicon nitride layer 4, polysilicon layer 3, and pad oxide layer 2 are patterned to islands such that a selected region for the isolation of devices is exposed.

Referring to FIG. 1B, to form a field oxide at the region for the isolation of devices in the exposed semiconductor substrate 1, a thermal oxidation process is performed wherein non-exposed three layer pattern acts as an oxidation barrier. As a result, a field oxide 5 is grown to a desired thickness.

Referring to FIG. 1C, the non-exposed two layers of the silicon nitride layer 4 and the polysilicon layer 3 are orderly removed. The silicon nitride layer 4 is removed by a wet etching of the etchant $H_3PO_4$, and the polysilicon by a dry etching utilizing plasma phenomenon.

However, according to the conventional PBLOCOS technology, voids 6 are created at the edges of non-doped polysilicon layer 3 due to property of polysilicon layer itself having a grain boundary. These voids contribute in the generation of the substrate-damaged portions 7 as shown in FIG. 1C, resulting in the depression in quality of the semiconductor device product.

SUMMARY OF THE INVENTION

Accordingly, it is an object of the invention to provide a process for the isolation between the semiconductor devices, capable of solving a problem generating substrate damaged region due to voids, which are created in non-doped polysilicon during PBLOCOS process.

This process provides improved isolation property by forming a buffer layer of two stacked structure with non-doped polysilicon layer and the overlying amorphous silicon layer on a pad oxide layer.

BRIEF DESCRIPTION OF THE DRAWINGS

Further objects and advantages of the present invention will be apparent from the following description, reference being had to the accompanying drawings wherein preferred embodiment of the present invention are clearly shown.

In the drawings.

DETAILED DESCRIPTION OF THE PRESENT INVENTION

FIGS. 2A–2D are simplified cross-sectional view diagrams illustrating a method for the isolation between semiconductor devices according to one embodiment of the present invention. They are merely an example of one embodiment according to the present invention and thus, one of the ordinary skill in the art would recognize that other variations, alternatives, and modifications would be applicable.

Figure 1A:
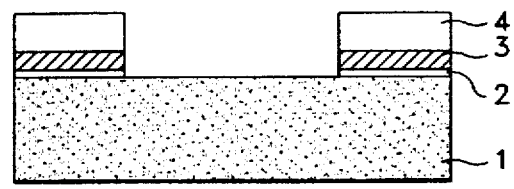
FIGS. 1A–1C are simplified cross-sectional view diagrams illustrating a method for the isolation between semiconductor devices according to the conventional art.
Figure 1B:
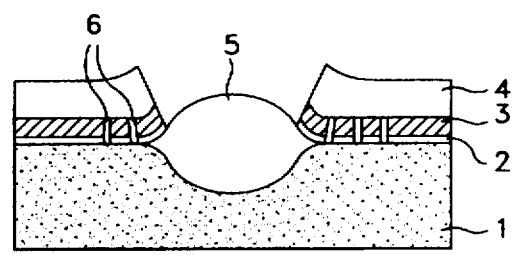
Figure 1C:
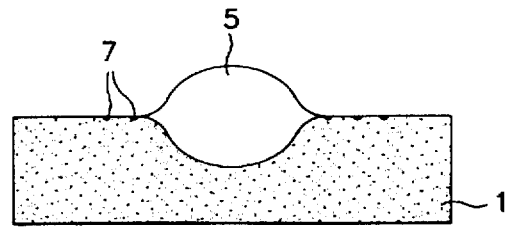
Figure 2A:
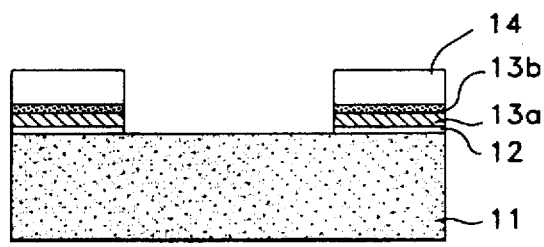
FIGS. 2A–2C are simplified cross-sectional view diagrams illustrating a method for the isolation between semiconductor devices according to the present invention.

Referring to FIG. 2A, a pad oxide 12 with a thickness of 100–200 Å is formed on a semiconductor substrate 11, to prevent defects due to stress transferred into the selected active regions. A buffer layer of "two layer stacked" structure with non-doped polysilicon layer 13a and the overlying amorphous silicon layer 13b is formed on the pad oxide layer 12, to prevent the substrate 11 from being damaged and the active regions from decreasing due to bird's beak. The amorphous silicon layer 13b is formed with the in situ process, which forms the amorphous silicon layer 13b on the non-doped polysilicon layer 13a without breaking the vacuum state, at the same reaction chamber where the underlying non-doped polysilicon layer 13a has been formed. The polysilicon layer 13a is formed at a thickness of 200–250 Å with LPCVD technology wherein supplying gas is $SiH_4$ and temperature is 500°–550° C. In addition, the amorphous silicon layer 13b is formed at a thickness of 250–350 Å with LPCVD technology wherein the atmospheric gas is $N_2/NH_3$ and a supplying gas is $Si_nH_{2n+2}$, n being an integer, with the preferred application being when n is 1 or 2).

A silicon nitride layer 14 of $Si_3N_4$ is formed on the amorphous silicon 13b at a thickness of 1,500–2,000 Å with LPCVD technology wherein supplying gas is $SiH_2Cl_2/NH_3$ and temperature is 750°–850° C. Thereafter, a mask(not shown) is formed to expose selected non-active regions on the silicon nitride layer 14. The silicon nitride layer 14, the underlying amorphous silicon layer 13b, the underlying undoped polysilicon layer 13a, and the underlying pad oxide layer 12 of the selected regions are removed in that order by etching process.

Figure 2B:
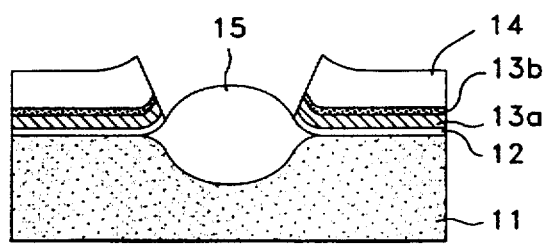

Referring to FIG. 2B, to form a field oxide 15 at the region for the isolation of devices in the exposed semiconductor substrate 11, a selective thermal oxidation process is performed wherein non-exposed three layer pattern acts as an oxidation barrier. As a result, a field oxide 15 is grown at a thickness of 4,000–6,000 Å.

Figure 2C:
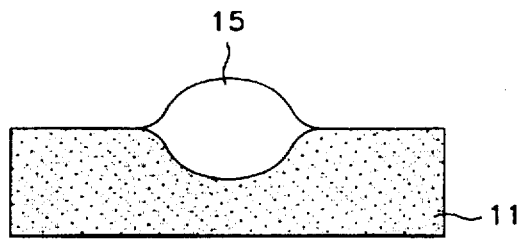

Referring to FIG. 2C, the silicon nitride layer 14, amorphous silicon layer 13b, and non-doped polysilicon layer 13a are removed in that order by a etching process. The silicon nitride layer 14 is removed by a wet eching of a etchant $H_3PO_4$, and the amorphous silicon layer 13b and non-doped polysilicon layer 13a are removed by a dry etching using plasma phenomenon.

As described hereinbefore, the process for the isolation according to the present invention, uses a buffer layer of two layers-stacked structure with a non-doped polysilicon layer and the overlying amorphous silicon layer. Through the use of this buffer layer, the invention provides an effect not only to prevent the creation of voids in the non-doped polysilicon layer but to prevent the generation of damaged region in the substrate.

Other features, advantages and embodiments of the invention disclosed herein will be readily apparent to those exercising ordinary skill after reading the foregoing disclosures. In this regard, while specific embodiments of the invention have been described in considerable detail, variations and modifications of these embodiments can be effected without departing from the spirit and scope of the invention as described and claimed.

What is claimed is:

1. A method for forming a field oxide for isolation between the semiconductor devices comprising the steps of:

providing a semiconductor substrate where a pad oxide film overlies thereon;

forming sequentially, a non-doped polysilicon layer and amorphous silicon layer on the semiconductor substrate with pad oxide film thereon;

forming a growth-preventive layer for preventing the growth of said pad oxide film by thermal oxidation; and removing said growth preventive layer, amorphous silicon layer, and non-doped polysilicon layer in regions selected for isolation between the semiconductor devices, to expose said pad oxide layer; and thermally oxidizing exposed pad oxide of the selected regions to form a field oxide layer for isolation of semiconductor devices.

2. The method in accordance with claim 1, wherein said non-doped polysilicon layer is formed at a temperature of 500°–550° C.

3. The method in accordance with claim 2, wherein said non-doped polysilicon layer is formed at a thickness of 200–250 Å.

4. The method in accordance with claim 1, wherein said amorphous silicon layer is formed by in-situ process.

5. The method in accordance with claim 4, wherein said amorphous silicon layer is formed by a LPCVD technology.

6. The method in accordance with claim 5, wherein said amorphous silicon layer is formed at a temperature of 500°–550° C.

7. The method in accordance with claim 5, wherein supplying gas for the formation of said amorphous silicon layer is $Si_nH_{2n+2}$ where n is an integer.

8. The method in accordance with claim 7, wherein n is selected from either value of 1 or 2.

9. The method in accordance with claim 7, wherein an atmosphere gas used in the LPCVD method is $N_2/NH_3$.

10. The method in accordance with claim 5, wherein said amorphous silicon layer is formed at a thickness of 250–350 Å.

11. The method in accordance with claim 1, wherein the growth-preventive layer is a silicon nitride.

12. The method in accordance with claim 11, wherein the silicon nitride is $Si_3N_4$.

* * * * *